United States Patent [19]

Kelly et al.

[11] 4,134,077
[45] Jan. 9, 1979

[54] AMPLIFIER CIRCUIT OPERABLE OVER A WIDE TEMPERATURE RANGE

[75] Inventors: Ronald D. Kelly, San Pedro; William L. Cannon, Encino, both of Calif.

[73] Assignee: System Development Corporation, Santa Monica, Calif.

[21] Appl. No.: 843,710

[22] Filed: Oct. 20, 1977

[51] Int. Cl.² .............................................. H03F 3/45
[52] U.S. Cl. ......................................... 330/69; 330/65
[58] Field of Search ................. 330/65, 69, 87, 207 R; 313/256, 312

[56] References Cited

U.S. PATENT DOCUMENTS

| | | | |
|---|---|---|---|
| 2,796,468 | 6/1957 | McDonald | 330/69 |
| 2,887,605 | 5/1959 | Karabats | 313/256 X |
| 2,930,982 | 3/1960 | Patterson | 330/69 |
| 3,299,309 | 1/1967 | Claypool | 313/256 X |

OTHER PUBLICATIONS

Kidokoro et al., "DC Amplifier Using Electrochemical Device," *Electronics and Communications in Japan* vol. 55-C, No. 10, Oct. 1972, pp. 115–121.

*Primary Examiner*—James B. Mullins
*Attorney, Agent, or Firm*—Fulwider, Patton, Rieber, Lee & Utecht

[57] ABSTRACT

An amplifier circuit having stable performance characteristics over a wide temperature range from approximately 0° C up to as high as approximately 500° C, such as might be encountered in a geothermal borehole. The amplifier utilizes ceramic vacuum tubes connected in directly coupled differential amplifier pairs having a common power supply and a cathode follower output stage. In an alternate embodiment, for operation up to 500° C, positive and negative power supplies are utilized to provide improved gain characteristics, and all electrical connections are made by welding. Resistor elements in this version of the invention are specially heat treated to improve their stability with temperature.

2 Claims, 2 Drawing Figures

AMPLIFIER CIRCUIT OPERABLE OVER A WIDE TEMPERATURE RANGE

BACKGROUND OF THE INVENTION

The United States government has rights in this invention pursuant to Contract #E(04-3)-1184 and Contract #E(04-3)-1330, both awarded by the United States Energy Research and Development Administration.

The present invention relates generally to electronic amplifiers, and, more particularly, to amplifiers for use in high temperature environments, such as in geothermal or other deep wells.

In drilling geothermal wells and other types of deep wells, it is often necessary to measure physical parameters, such as pressure and temperature, at the bottom of the well, and to transmit this information up to the surface. Typically, a instrumentation package, sometimes referred to as a sonde, is lowered down the borehole for this purpose. Since the borehole may be several thousand feet in depth, signals generated at the bottom of the borehole must first be amplified before they can be transmitted to the surface. However, temperatures in the borehole may reach several hundred degrees centigrade, and conventional amplifiers, whether using vacuum tubes or solid state devices, will not function for very long, if at all, at these temperatures.

Prior to this invention, the only technique for combatting this difficulty was to enclose and required electronic equipment in an insulating jacket, such as a Dewar flask, to insulate the equipment from the high environmental temperatures for a limited period of time. Electronic equipment protected in this manner is not only severely limited in the time for which it may operate reliably, but is also subjected to a gradual increase in temperature over this time, resulting in an accompanying gradual change in operating characteristics, such as amplifier gain.

Accordingly, there has long been a need for amplifier circuitry which can withstand temperatures up to several hundred degrees centrigrade, and which has stable gain and other characteristics over a wide temperature range. The present invention fulfills this need.

SUMMARY OF THE INVENTION

The present invention resides in an amplifier circuit utilizing ceramic vacuum tubes which are directly coupled, to avoid the use of temperature sensitive capacitance elements, and which are arranged in dual differential stages to minimize losses in gain.

More specifically, the apparatus of the invention comprises at least two cascaded dual differential amplifier stages, connected by direct coupling, and a cathode follower output stage, also employing direct coupling, to receive a signal from one tube of the final dual differential amplifier stage. Also included is a feedback circuit connected from the cathode circuit of the cathode follower output stage to the grid circuit of the first of the dual differential amplifier stages.

In one embodiment of the invention, designed to operate up to 500° C., two power supplies are employed, one positive and the other negative with respect to ground, to provide a relatively high overall gain in spite of the use of direct coupling. In this embodiment, those of the resistance elements which dissipate relatively large amounts of power are wire-wound and are specially heat treated to provide a relatively uniform resistivity over a wide temperature range.

From the foregoing summary, it will be apparent that the present invention provides a hitherto unavailable amplifier circuit for operation in high-temperature environments. Other aspects and advantages of the present invention will become apparent from the following more detailed description, taken in conjunction with the accompanying drawings.

DETAILED DESCRIPTION

Figure 1:
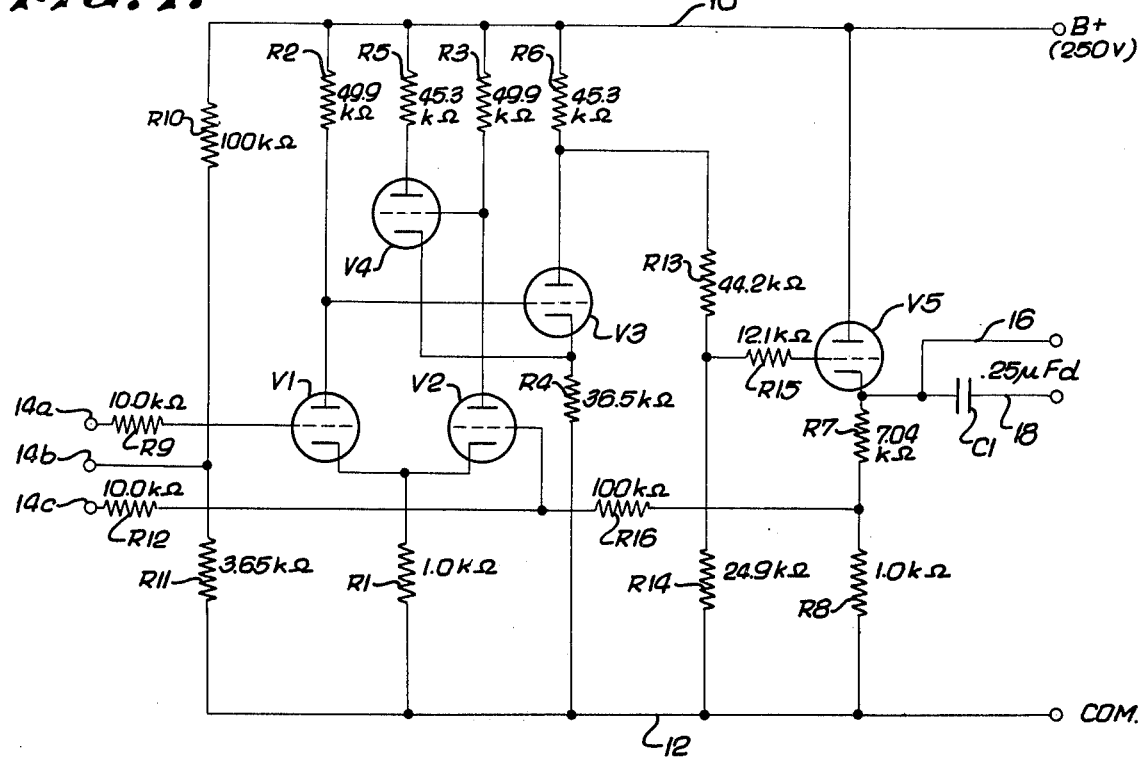
FIG. 1 is a schematic diagram of an amplifier circuit embodying features of the present invention and capable of operating over a range from approximately 0° C. to approximately 260° C.

As shown in the drawings for purposes of illustration, the present invention is concerned with electronic amplifiers capable of operating over a wide temperature range with relatively stable gain characteristics. Conventional amplifiers have to be specially insulated or cooled in order to operate in high-temperature environments, such as in geothermal wells. Such insulated amplifiers are severely limited as to their duration of reliable use, and their gain characteristics tend to vary substantially during the time of use.

In accordance with the present invention, an amplifier circuit is provided with the capability of operating over a wide temperature range without special insulation or cooling. As shown in FIG. 1, which illustrates one embodiment of the invention capable of operation over a temperature range from approximately 0° C. to approximately 260° C., the amplifier of the invention includes a first differential stage comprising vacuum tubes V1 and V2, a second differential stage, cascaded with the first, comprising vacuum tubes V3 and V4, and a cathode follower output stage utilizing vacuum tube V5. All of the vacuum tubes V1–V5 are of the ceramic type and are manufactured by General Electric Company. Tubes V1 and V2 are preferably GE 7588, and tubes V3, V4 and V5 are GE 7296.

Ceramic vacuum tubes are designed primarily for use in airborne and other military applications in which components may not be well ventilated, and may be subjected to fairly high local temperatures due to heat dissipated in the tubes themselves, rather than due to environmental conditions. Capacitors are typically employed in vacuum tube circuits, even those of the ceramic type, but no capacitors could be found which would be stable, or even operative, at high temperatures. Consequently, direct coupling of the amplifier stages, using resistors alone, had to be employed. Direct coupling inherently results in a build-up of dc voltage from stage to stage, and in a relatively low overall gain through the amplifier. As will be seen, use of dual differential stages in the manner of the invention minimizes these disadvantages of direct coupling, and produces an amplifier with good gain characteristics which are stable over a desired wide temperature range.

The vacuum tubes V1–V5 are supplied with high voltage power from a positive or B+ power supply bus, indicated by reference numeral 10, and a common power supply bus, indicated by reference numeral 12. The cathodes of tubes V1 and V2 are both connected through a single cathode resistor R1 to the common bus 12, and the anodes or plates of tubes V1 and V2 are connected through resistors R2 and R3, respectively, to the B+ bus 10. Similarly, the second stage dual differential amplifier has the cathodes of tubes V3 and V4 both connected through a single cathode resistor R4 to the common bus 12, and has the plates of the tubes connected through resistors R5 and R6, respectively, to the B+ bus 10. The output tube V5 has its plate directly connected to the B+ bus 10, and has its cathode connected through resistors R7 and R8, in series, to the common bus 12.

It should be noted in passing that, as is conventional in the illustration of vacuum tube circuitry, the tube heating filaments and their power supply have been omitted from the drawings.

An input signal to be amplified is applied to the terminals 14a, 14b and 14c. A typical input signal would be derived from a seismic transducer known as a geophone, which generates a voltage signal in an inductive coil, the ends of which would be connected to terminals 14a and 14c, and the center tap of which would be connected to terminal 14b. The terminal 14a is connected through a resistor R9 to the grid terminal of tube V1, and the terminal 14c is connected through a resistor R12 to the grid terminal of tube V2. The terminal 14b is connected to the junction point of two series-connected resistors R10 and R11, which are, in turn, connected between the B+ bus 10 and the common bus 12. The series-connected resistors R10 and R11 act as a voltage divider, and apply a biasing voltage through the internal impedance of the input device which generates the input signal, to the grids of the tubes V1 and V2 of the input stage. Typically, the grids of the tubes V1 and V2 are biased in this manner to a positive voltage of approximately six volts. The common cathode resistor R1 and the plate resistors R2 and R3 are selected to have values such that the cathodes of tubes V1 and V2 are self-biasing to slightly more than +6V.

The input signal supplied to the terminals 14a, 14b and 14c is such that the voltage level on 14a becomes positive with respect to the center terminal 14b at the same time as the voltage level on 14c becomes negative. The input signal is therefore applied to the differential amplifier pair V1 and V2 in a push-pull manner, with the voltage on the grid of V1 making positive excursions at the same time that the voltage on the grid of V2 is making negative excursions, and vice versa.

The output signal taken from the plate of tube V1 is directly connected to the grid terminal of tube V3 of the next stage, and the output signal from the plate of tube V2 is directly connected to the grid of tube V4 of the next stage. This direct coupling biases the grids of tubes V3 and V4 to a relatively high value, and a relatively high resistance value for the common cathode resistor R4 is therefore required to bias the cathodes of the tubes V3 and V4 to a value more positive than the corresponding bias voltages on the grids of these tubes. If a single stage amplifier, as contrasted with a dual differential amplifier, were used, this large cathode resistor would seriously affect the gain of the stage, since there would be a large signal voltage drop across the cathode resistor. However, in the dual differential configuration used, the signal currents through the tubes V3 and V4 will be self-cancelling in the common cathode resistor R4, with a consequent improvement in gain through the stage.

Output from the second differential stage comprising tubes V3 and V4 is taken from the plate terminal of tube V3, and is connected to a voltage divider comprising two series-connected resistors R13 and R14 connected between the plate of tube V3 and the common bus 12. The voltage divider utilizing resistors R13 and R14 is needed in order to reduce the plate voltage obtained from tube V3 to an appropriate value for connection to the grid of the output stage, i.e. tube V5. The grid of tube V5 is supplied from the junction point of resistors R13 and R14, through another resistor R15. The output stage is a conventional cathode follower circuit, the output of which is obtained from the cathode terminal. Two alternate means of output are illustrated. Output terminal 16 is connected directly to the cathode of tube V5, and output terminal 18 is connected through a capacitor C1 to the cathode terminal. The capacitor C1 is utilized to decouple the output signal from the direct current bias on the cathode of tube V5. Consequently, any degradation in the capacitance value of capacitor C1 is of little consequence to the performance characteristics of the amplifier.

The cathode resistors R7 and R8 in the output stage also operate as a voltage divider for purposes of providing a negative feedback signal which is connected from the junction point between R7 and R8, through a feedback resistor R16 to the grid of tube V2 of the first or input stage. The purpose of the negative feedback circuit is, as is conventional, to reduce distortion and noise and, more importantly, to stabilize the gain as it might be affected by variations in circuit parameters due to temperature change.

The circuit illustrated in FIG. 1 has a demonstrated capability of maintaining stable characteristics over an approximate range from 0° C. to 260° C. The resistance values used are shown in the drawing, although it will be appreciated that various changes may be made in the circuit parameters without departing from the invention.

Figure 2:
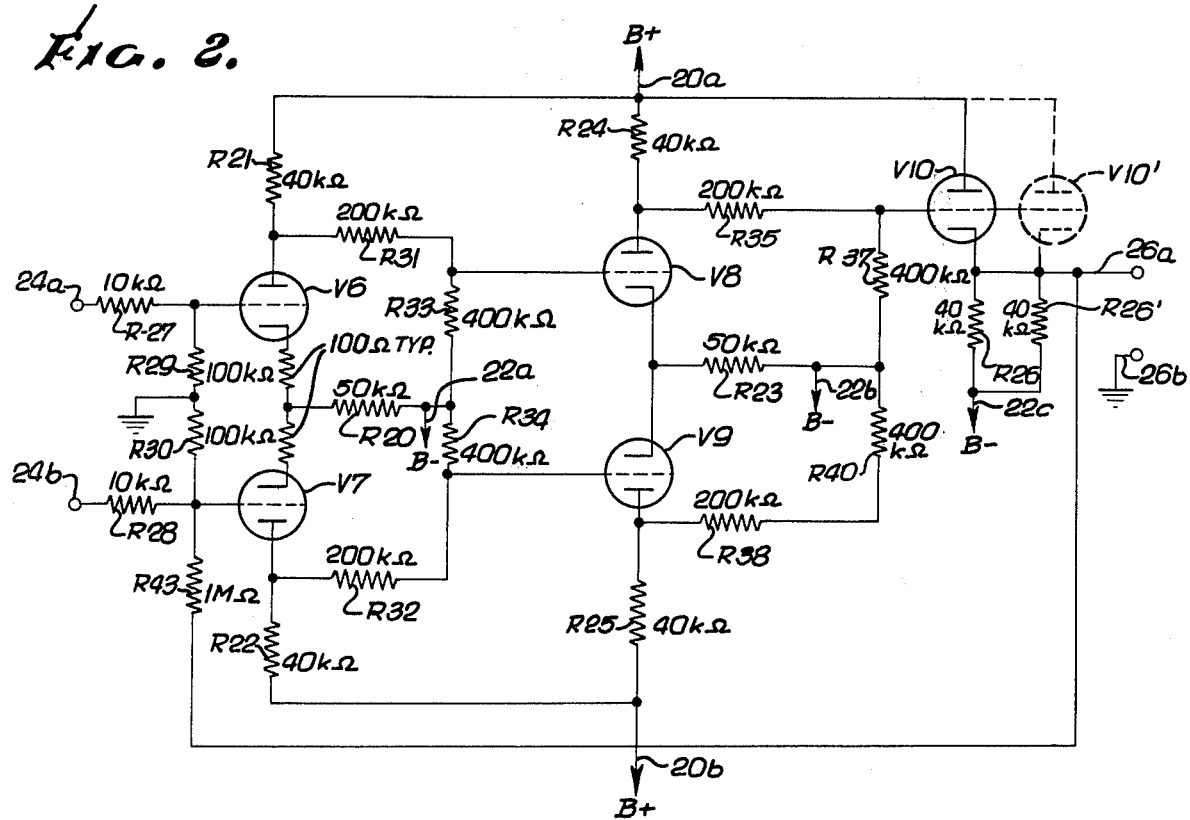
FIG. 2 is a schematic diagram of an alternate embodiment of the invention capable of operating up to approximately 500° C.

The amplifier circuit shown in FIG. 2 has a capability of operating up to approximately 500° C. The capability to operate at even higher temperatures than the circuit shown in FIG. 1 arises principally from the use of a dual high voltage power supply, together with the use of heat-treated wire-wound resistors to provide relatively stable resistance values over the wider temperature range.

The dual power supply for the FIG. 2 circuitry is connected through a positive power supply bus indicated at 20a and 20b, and a negative power supply bus indicated at 22a, 22b and 22c. The amplifier again comprises a first dual differential stage, utilizing vacuum tubes V6 and V7, a second dual differential stage, utilizing vacuum tubes V8 and V9, and a cathode follower output stage, utilizing tube V10. Again, the tubes are of the ceramic type and may be GE 7462 tubes. As in FIG. 1, the tube heating filaments and their power supply have been omitted.

Tubes V6 and V7 of the first or input stage of the amplifier have their cathode terminals commonly connected through a single resistor R20 to the negative power supply bus at 22a. The tube V6 has its anode or plate connected through resistor R21 to the positive power supply bus at 20a, and tube V7 has its plate connected through resistor R22 to the positive power supply bus at 20b. Similarly, in the second stage, tubes V8 and V9 have their cathode terminals commonly connected through a single resistor R23 to the negative power supply bus at 22b. Tube V8 has its plate connected through resistor R24 to the positive power supply bus at 20a, while tube V9 has its anode connected through resistor R25 to the positive power supply bus at 20b. The output tube V10 has its plate directly connected to the positive power supply bus at 20a, and has its cathode connected through a resistor R26 to the negative power supply bus at 22c.

An input signal is applied to terminals 24a and 24b, and is connected through resistors R27 and R28 respectively to the grids of tubes V6 and V7, respectively. The grids of tubes V6 and V7 are also each connected to ground through resistors R29 and R30, respectively, and are thereby effectively biased to ground potential. The common cathode resistor R20 for tubes V6 and V7 has to be relatively large in order to bias the cathodes of these tubes to a high enough positive value. Again, however, the signal voltages across the common cathode resistor R20 will be self-cancelling, and no substantial loss of gain will be experienced because of the use of the large cathode resistor.

The output signal from tube V6 is coupled from the plate through a resistor R31 to the grid of tube V8, and the output signal from tube V7 is coupled from the plate through a resistor R32 to the grid of tube V9. The grids of tubes V8 and V9 are also connected through resistors R33 and R34, respectively, to the negative power supply bus at 22a. The resistors R31 and R33 operate as a voltage divider to provide an appropriate bias voltage for application to the grid of tube V8, and, in the same fashion, the resistors R32 and R34 operate as a voltage divider to provide an appropriate bias voltage for application to the grid of tube V9.

In the second dual differential stage, utilizing tubes V8 and V9, the signal is further amplified and is output from the plate of tube V8 through resistor R35 and thence to the grid of output tube V10, which is also connected through a resistor R37 to the negative power supply bus at 22b. Accordingly, the resistors R35 and R37 operate as a voltage divider to provide an appropriate bias to the grid of tube V10. The symmetry of the second differential stage is preserved by connection of the plate of tube V9 through two series-connected resistors R38 and R40, to the negative power supply bus at 22b. The cathode follower output circuit is conventional, the output signal being connected across terminal 26a which is connected to the cathode of tube V10, and terminal 26b, which is grounded.

Also included in the FIG. 2 circuit is a negative feedback path, from the cathode of the output tube V10 to the grid of input tube V7, through a feedback resistor R43. The output stage may also include a second tube V10', shown in phantom in FIG. 2, to reduce overall heat dissipation in the output stage and to reduce the output impedance. The corresponding terminals of V10 and V10' are commonly connected as shown, and an additional cathode resistor R26' is connected in parallel with resistor R26.

For operation up to 500° C., all of the electrical connections in the circuit of FIG. 2 must be completed by welding rather than by soldering. In addition, wire-wound resistors, which are used for the resistance elements dissipating a substantial amount of power, i.e. the resistance elements in the cathode and plate circuits of the tubes, have to be specially heat treated for a more stable resistivity over the desired temperature range. The specific heat treatment involved is to maintain the resistors at approximately 600° C. for a period of 7–8 hours. The wire-wound resistors are preferably of the ceramic coated type designed for high temperature use, although not intended for use at the high temperatures to which they can be subjected in accordance with the present invention. Resistors not dissipating large amounts of power, i.e., those not in the cathode and plate circuits of the tubes, may be of the thick-film type.

It will be appreciated from the foregoing that the present invention represents a significant advance in the field of amplifiers for use at high temperatures, and more particularly, for use over ranges between 0° C. and approximately 500° C. It will also be appreciated that various changes and modifications may be made in the circuits illustrated herein without departing from the spirit and scope of the invention. Accordingly, the invention is not to be limited except as by the appended claims.

We claim:

1. An amplifier circuit having relatively stable characteristics over a wide temperature range up to several hundred degrees centigrade, said amplifier comprising:
    at least two cascaded dual differential amplifier stages employing ceramic vacuum tubes;
    a cathode follower output stage also employing a ceramic vacuum tube;
    resistor means for directly coupling said amplifier stages and for appropriately biasing the electrodes of said tubes;
    a common power supply coupled to said vacuum tubes; and
    input circuit means connected to couple an input signal to a first of said dual differential amplifier stages in such a manner that a variation in the magnitude of the input signal results in corresponding variations in current through the tubes of said first stage, and such that the currents in said tubes vary in opposite directions;
    wherein each of said dual differential amplifier stages has a common cathode resistor across which there is essentially zero voltage drop due to signal currents through the two tubes of the stage;
    and wherein said power supply comprises a positive voltage source coupled to the plates of said tubes and a negative voltage source coupled to the cathodes of said tubes, whereby the grids of said tubes in said first amplifier stage can be maintained at substantially ground potential;
    and wherein all resistors connected in the cathode and anode circuits of said tubes are wire-wound and heattreated for stability up to approximately 500° C.;
    and wherein all connections in said amplifier are welded.

2. An amplifier as set forth in claim 1, and further including a negative feedback circuit from said output stage to said first dual differential amplifier stage.

* * * * *